(12) United States Patent
Ataka et al.

(10) Patent No.: US 7,519,942 B2
(45) Date of Patent: Apr. 14, 2009

(54) PATTERN SPECIFICATION METHOD AND PATTERN SPECIFICATION APPARATUS

(75) Inventors: Masashi Ataka, Tokyo (JP); Hitomi Sato, Toyko (JP)

(73) Assignee: Holon Co., Ltd., Tokyo (JP)

(*) Notice: Subject to any disclaimer, the term of this patent is extended or adjusted under 35 U.S.C. 154(b) by 367 days.

(21) Appl. No.: 11/312,612

(22) Filed: Dec. 21, 2005

(65) Prior Publication Data

US 2006/0169896 A1    Aug. 3, 2006

(30) Foreign Application Priority Data

Feb. 1, 2005    (JP) .............................. 2005-024957

(51) Int. Cl.
  *G06F 17/50* (2006.01)
(52) U.S. Cl. .............................. 716/21; 716/4
(58) Field of Classification Search ........................ None
  See application file for complete search history.

(56) References Cited

U.S. PATENT DOCUMENTS

| 6,671,861 | B2 * | 12/2003 | Noda ............................. 716/4 |
| 6,757,875 | B2 * | 6/2004 | Matsuoka ....................... 716/4 |
| 7,155,698 | B1 * | 12/2006 | Gennari ........................ 716/19 |
| 7,175,940 | B2 * | 2/2007 | Laidig et al. ................... 430/5 |

* cited by examiner

*Primary Examiner*—Leigh Marie Garbowski
(74) *Attorney, Agent, or Firm*—Staas & Halsey LLP

(57) ABSTRACT

A pattern specification method for specifying a drawn microscopic pattern, comprising the step of creating a first pattern in which process shift information is reflected on a pattern expressed by design data, the step of enlarging the drawn pattern, the step of performing pattern matching between the first pattern which corresponds to the drawn pattern to-be-specified or a pattern which include patterns surrounding this first pattern and the enlarged pattern or an enlarged pattern which includes enlarged patterns surrounding this enlarged pattern, and the step of outputting the enlarged pattern which matches most in the pattern matching.

18 Claims, 5 Drawing Sheets

CAD DATA

NEGATIVE TYPE →

POSITIVE TYPE

TONE INFORMATION
(POSITIVE/NEGATIVE)

CAD DATA PATTERN
(WITH PROCESS SHIFTS
ADDED THERETO)

ACTUAL MASK PATTERNS IMAGE

PROCESS SHIFT INFORMATION

Fig. 3A

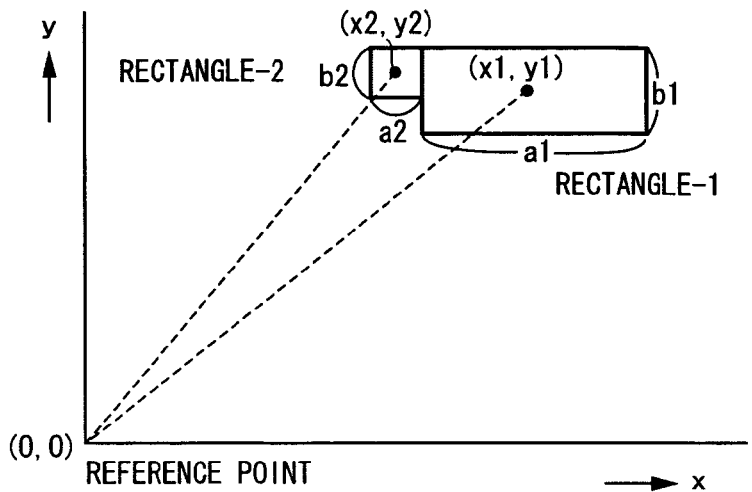

Fig. 3B

DRAWING    DEVELOPING    ETCHING

RECTANGLE-1 : (X1, Y1, a1, b1) + TONE DATA((△11, △11'), (△12, △12'), (△13, △13'))
(POSITIVE or NEGATIVE)

RECTANGLE-2 : (X2, Y2, a2, b2) + TONE DATA+ ((△21, △21'), (△22, △22'), (△23, △23'))

Fig. 3C

PROCESS SHIFTS = DRAWING PROCESS SHIFT
+ DEVELOPING PROCESS SHIFT
+ ETCHING PROCESS SHIFT

Fig. 3D

EXAMPLE : WHEN DRAWING PROCESS SHIFTS (△11, 11') ARE 0.01 $\mu$m AND 0.005 $\mu$m, RESPECTIVELY,

- X-DIRECTIONAL DIMENSION OF PATTERN BECOMES a1 + △11 = a1 + 0.01 $\mu$m, AND
- Y-DIRECTIONAL DIMENSION BECOMES b1 + △11' = b1 + 0.005 $\mu$m

Fig. 3E

{ THICKENING EXAMPLE    CONTACT HOLE (POSITIVE)
  FINING EXAMPLE        GATE LAYER PATTERN (NEGATIVE)

DESIGNATION METHOD IN PRIOR ART

DESIGNATION METHOD IN INVENTION

PATTERN SPECIFICATION METHOD AND PATTERN SPECIFICATION APPARATUS

BACKGROUND OF THE INVENTION

1. Field of the Invention

The present invention relates to a pattern specification method and a pattern specification apparatus which specify a drawn microscopic pattern.

2. Description of the Related Art

In recent years, the dimension of a microscopic pattern drawn on a semiconductor LSI or a mask (reticle) has been measured so as to enhance a quality, an available percentage, etc.

Heretofore, a person has designated and precisely measured a pattern to-be-measured by reference to design data in such a way that the drawn pattern is scanned with an electron beam finely focused in a scanning electron microscope (hereinbelow, abbreviated to "SEM"), that emitted secondary electrons are detected so as to synchronously display a SEM image on a screen, and that the enlarged pattern of the pattern to-be-measured is displayed on the SEM image.

Therefore, in a case where the integration density of semiconductor LSI patterns heightens, where the dimensions and precision of the designed patterns are made as fine as 0.036 μm and ±0.005 μm or so, respectively, and where the number of similar patterns becomes very large, it has become difficult to the person to have the design data displayed on the screen, and to satisfactorily confirm and specify the pattern to-be-measured on the image so as to precisely perform a length measurement. Besides, it has occurred as another problem that the number of the patterns whose lengths are to be measured increases (to, for example, several hundreds to several thousands), so the person is, in effect, incapable of specifying the patterns one by one.

Especially when the dimension of the pattern becomes small as stated above, the width of the pattern fabricated by actual drawing becomes larger or smaller than the design data under the intenser influence of the processes of a resist (processes such as drawing, developing and etching). Unless the influence of the processes of the resist are considered, it is very difficult for a person to specify the pattern for the length measurement or the like, among a plurality of patterns whose widths are similar, but are slightly different. Accordingly, there has been the problem that mistakes often occur.

SUMMARY OF THE INVENTION

According to the invention, to solve those problems, a pattern to-be-measured for a length measurement is specified by the pattern matching between a pattern which is based on design data and on which the tone data (positive or negative type) of a resist and the process shifts of the resist are reflected, and a pattern which is obtained by enlarging and displaying a pattern drawn on a semiconductor LSI or a mask.

BRIEF DESCRIPTION OF THE DRAWINGS

FIGS. 3A through 3E are diagrams for explaining tone information and process shift information;

DETAILED DESCRIPTION OF THE INVENTION

According to the present invention, even in a case where the dimensions of patterns are microscopic and where the number of the patterns is enormous, a pattern to-be-handled can be specified reliably, precisely and fast without resorting to man power, for a length measurement or the like among the drawn patterns on the basis of design data, tone data and process shifts.

Now, the invention will be described in detail by taking as an example a length measurement apparatus in which the invention is applied to a scanning electron microscope (SEM).

Figure 1:
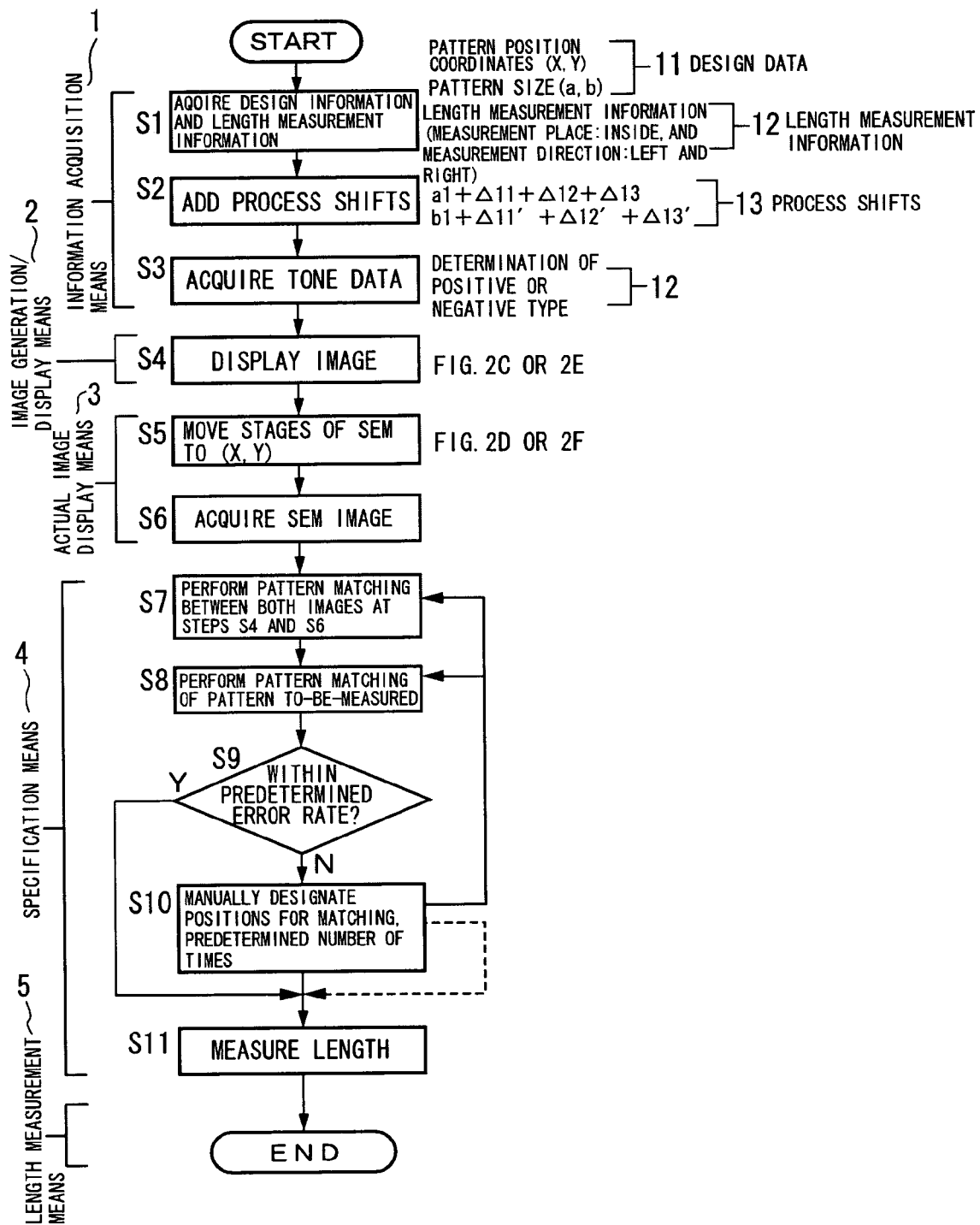
FIG. 1 is a flow chart for explaining the operation of the present invention.

FIG. 1 shows a flow chart for explaining the operation of the invention.

Referring to FIG. 1, a step S1 acquires design information and length measurement information. At this step, as indicated at the right part of the drawing, the following items are acquired or inputted from a database (for example, the database of CAD data), not shown, with regard to the pattern to-be-measured of, for example, a mask (reticle) having the pattern whose length is to be measured by the SEM, and the length measurement place of the pattern:

Pattern position coordinates (X, Y) (Center position of the pattern on design)

Pattern size (a, b)

Length measurement information (Measurement place: Inside, and Measurement direction: Left and right)

At step S2 process shifts is added. At this step, the process shifts (necessary ones of the drawing process shift, developing process shift and etching process shift) of a resist for use in pattern fabrication are added as will be described with reference to FIG. 3A through FIG. 5B later, and the pattern (size) which is actually fabricated from the resist is predicted.

At step S3 tone data is acquired. At this step, the tone data which express the distinction between the positive type and negative type of the resist for use in the pattern fabrication are acquired, so as to determine either the positive type or the negative type.

At step S4 an image is displayed. At this step, the process shifts acquired at the step S2 are added to the pattern of the design data acquired at the step S1, the size of a pattern expected when the pattern is fabricated from the used resist is computed in further consideration of the tone data acquired at the step S3, and the pattern after the computation is displayed. On this occasion, the pattern whose length is to be measured, and any pattern which lies nearby are conjointly displayed on a screen (by way of example, they are displayed as shown in FIG. 2C or FIG. 2E).

At step S5 the stages of the SEM to the coordinates (X, Y) is moved.

At step S6 a SEM image is acquired. At the steps S5 and S6, the stages of the SEM are moved to the pattern position coordinates (X, Y) of the subject for the measurement acquired at the step S1, a secondary electron image is generated by the SEM, and the actual mask pattern image (SEM image of the pattern obtained after a substrate has been coated with the resist, and the pattern of the design data has been exposed to light, developed and etched) shown by way of example in FIG. 2D (a case where the tone data indicate the negative type) or FIG. 2F (a case where the tone data indicate the positive type) is acquired and displayed.

At step S7 the pattern matching between both the images of the steps S4 and S6 is performed.

At step S8 the pattern matching of the pattern whose length is to be measured is performed. The steps S7 and S8 are carried out as stated below. First, at the step S7, the pattern to-be-measured including the nearby pattern which is such that the process shifts of the resist and the tone data are reflected on the pattern expressed by the design data, are subjected to the pattern matching with the actual mask pattern image which has been acquired at the step S6. Herein, the pattern matching is a known technique wherein a matching degree (in terms of, for example, an area or an area rate) is repeatedly calculated while the positions and sizes of both pattern groups are being changed little by little within a predetermined range, and both patterns of the greatest matching degree are specified. Subsequently, at the step S8, both the images are subjected to the pattern matching as to the pattern to-be-measured, that is, the matching degree (in terms of, for example, an area or an area rate) between both the patterns is calculated. Here in the example, an error rate (a nonmatching degree) is calculated. In this way, which pattern on the actual mask pattern image is the pattern to-be-measured designated on the design data corresponds to is first specified by the information including the nearby pattern, whereupon the pattern matching is performed between the specified patterns so as to calculate the error rate (nonmatching degree).

At step S9 it is discriminated if the error rate calculated. This determines that the error rate acquired at the steps S7 and S8 is within a predetermined error rate. (The predetermined error rate in the case where the pattern of the design data and the pattern to-be-measured do not match, is obtained by repeating a large number of experiments.) Subject to "YES" at the step S9, it has been found that the calculated error rate is within the predetermined error rate, and hence, the routine proceeds to a step S11. Subject to "NO", the routine proceeds to a step S10, at which the pattern matching operations of both the images at the steps S7 and S8 are repeated a predetermined number of times while positions for matching are shifted within a predetermined region, so as to calculate the error rates on those occasions. When the error rate does not fall within the predetermined error rate in spite of repeating the pattern matching operations the predetermined number of times, a message is displayed for an operator, and the operator is prompted to designate a pattern to-be-measured. When the operator has designated the pattern to-be-measured, the routine can proceed to a step S11.

At the step S11 the length of the pattern to-be-measured is measured. At this step, the length is measured on the basis of the length measurement information (for example, measurement place: inside, and length measurement direction: left and right) designated at the step S1, for the pattern on the actual mask pattern image as automatically specified in accordance with "YES" at the step S9 owing to the small error rate of the pattern matching, or for the pattern on the image as designated by the operator because the automatic specification is impossible due to the large error rate. After the step S11, the routine is ended.

As described above, the length measurement system calculates the predicted pattern of a pattern which is fabricated from a resist, on the basis of the coordinates (X, Y) of the pattern to have its length measured, on design information, a pattern size (a, b), the process shifts (drawing process shift, developing process shift and etching process shift) of the used resist and the tone data (positive or negative type) of the used resist, the calculated pattern and any pattern nearby are subjected to pattern matching with a pattern group on an actual image, so as to specify the pattern to-be-measured of the actual image, and when a calculated error rate is within a predetermined error rate, the length of a place designated for the specified pattern is measured, whereby a large number of places can be measured precisely and fast. The operating steps will be successively described in detail below.

Incidentally, the steps S1 through S3 are executed by information acquisition means 1 incarnated by a program on a computer. The step S4 is executed by image generation/display means 2. The steps S5 and S6 are executed by actual image display means 3. The steps S7 through S10 are executed by specification means 4. The step S11 is executed by length measurement means 5.

FIGS. 2A through 2F are diagrams for explaining patterns.

Figure 2A:
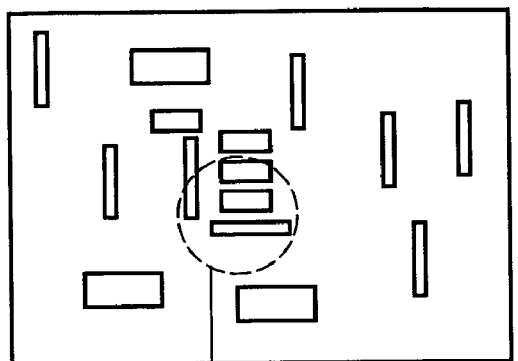
FIGS. 2A through 2F are diagrams for explaining patterns.

FIG. 2A shows a situation where design data are schematically expressed. The design data are those of the patterns of a mask. Usually, they are CAD data which design the various patterns as shown in the figure.

Figure 2B:
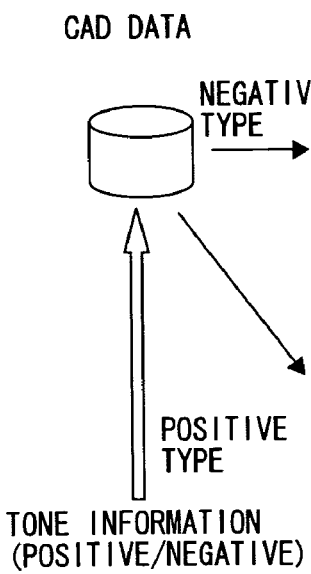
Figure 2C:

FIG. 2B exemplifies the CAD data. The CAD data are usually stored in a database. The information items of a resist for forming the patterns of the mask are reflected on the CAD data, thereby to generate patterns shown in FIG. 2C in the case of the resist of negative type or patterns shown in FIG. 2E in the case of the resist of positive type (as will be described in detail with reference to FIG. 3A through FIG. 4B). Herein, the information items of the resist are as follows:

Tone information:
 Positive or Negative
Process shift information:
 Drawing process shift
 Developing process shift
 Etching process shift Usually, the tone information and the process shift information are stored separately from the CAD data, and the patterns shown in FIG. 2C or FIG. 2E as explained below are generated in correspondence with the operator's designations of the sort of the resist for use and the positive or negative type thereof.

FIG. 2C schematically shows an example of the patterns which are expected after the resist of the negative type is exposed to light, developed and etched, and the process shifts are added, as to the patterns on the CAD data. Parts indicated in black are pattern parts where the resist has remained.

Figure 2D:
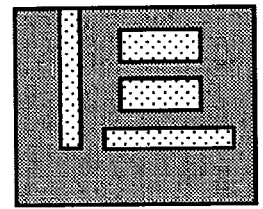
Figure 2E:

FIG. 2D shows an example of actual patterns on a secondary electron image based on the SEM, the actual patterns having been obtained by exposing the negative type resist to the light, developing and etching it as to the patterns on the CAD data. Here, the rectangular patterns are pattern parts where a Cr (chromium) film, for example, uniformly formed on a glass substrate has remained, and a dark part surrounding the rectangular patterns corresponds to a part where the glass of the substrate has appeared by the removal of the Cr film. Incidentally, when the Cr film is uniformly formed on the glass substrate, the actual mask pattern image is displayed as shown in FIG. 2D (the pattern parts, namely, the Cr film become(s) white, and the part except the pattern parts, namely, the glass substrate becomes gray), but when a film of molybdenum silicide or the like is formed on the glass substrate instead of the Cr film, the situation reverses (pattern parts, namely, the molybdenum silicide film become(s) gray, and the part except the pattern parts, namely, the glass substrate becomes white). Anyway, the situation depends upon a brightness in the case where the substrate itself (glass) and the film formed on the substrate are observed with the SEM. Hereinbelow, the case of forming the Cr film on the substrate (glass) will be described by way of example.

FIG. 2E schematically shows an example of the patterns which are expected after the resist of the positive type is exposed to light, developed and etched, and the process shifts are added, as to the patterns on the CAD data. Parts indicated in white are pattern parts where the resist has been removed.

Figure 2F:
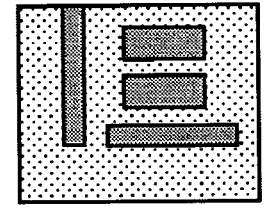

FIG. 2F shows an example of actual patterns on a secondary electron image based on the SEM, the actual patterns having been obtained by exposing the positive type resist to the light, developing and etching it as to the patterns on the CAD data. Here, the rectangular patterns are pattern parts where the Cr film, for example, uniformly formed on the glass substrate has been removed (here, parts where the substrate, namely, glass has appeared), and a bright part surrounding the rectangular patterns corresponds to a part where the Cr film has remained.

As described above, the pattern group which is computed on the basis of the CAD data so as to reflect the tone information (negative or positive type) and the process shift information to be explained below can be displayed as shown in FIG. 2C or FIG. 2E. Besides, the actual mask pattern group can be observed with the SEM and acquired as shown in FIG. 2D or FIG. 2F, the actual mask pattern group being actually formed in such a way that the substrate is uniformly coated with the negative or positive type resist designated by the tone information, and that the resist is exposed to the light, developed and etched on the basis of the CAD data. Subsequently, the pattern groups in FIG. 2C and FIG. 2D (or in FIG. 2E and FIG. 2F) are subjected to pattern matching so as to specify a pattern whose length is to be measured. Further, the pattern to-be-measured on the actual mask pattern group is subjected to pattern matching with the corresponding pattern on the pattern group based on the CAD data. On condition that the error rate of the pattern matching is equal to or less than a predetermined error rate, a designated length measurement can be performed for the specified pattern to-be-measured (the pattern to-be-measured in FIG. 2D or FIG. 2F).

Incidentally, since the process shifts have somewhat different values, depending upon the sorts and thicknesses of resists, these process shifts (the process shifts of drawing, developing and etching) are registered in correspondence with the sorts and thicknesses of the resists beforehand, the sort and thickness of the resist are designated in a measurement mode so as to fetch and use the corresponding ones of the registered process shifts. Besides, the process shifts (drawing, developing and etching) and tone data (distinction between the negative and positive types) of the resist may well be inputted and designated in the measurement mode.

FIGS. 3A through 3E show diagrams for explaining tone information and process shift information.

FIG. 3A shows examples of design information and length measurement information. The design information (for example, CAD data) is expressed by an X-Y coordinate system whose base point is a reference point (0, 0), and it is indicated by the center coordinates of each pattern and the pattern size (lateral and vertical dimensions) thereof. Rectangle-1 and rectangle-2 illustrated by way of example have the following information items:

Rectangle-1:
    Pattern position coordinates: (x1, y1)
    Pattern size: a1×b1
    Length measurement information:
        Measurement place: Inside (or Outside) pattern
        Measurement direction: Left and right (or Up and down)
        Other: Measurement place (such as Central part of Pattern)
Rectangle-2:
    Pattern position coordinates: (x2, y2)
    Pattern size: a2×b2
    Length measurement information:
        Measurement place: Inside (or outside) pattern
        Measurement direction: Left and right (or Up and down)
        Other: Measurement place (such as Central part of Pattern)

FIG. 3B shows an example of the pattern information of the rectangle-1 subjected to the reflection of process shift information. Here, the pattern information indicated in the figure is as follows:

Rectangle-1: (x1, y1, a1, b1)+Tone data+(($\Delta$11, $\Delta$11')+($\Delta$12, $\Delta$12')+($\Delta$13, $\Delta$13'))

Here, the rectangle-1 expresses a rectangle-1 in FIG. 3A. (x1, y1, a1, b1) denote the X-coordinate=x1 and Y-coordinate=y1 of the center position of the pattern of the rectangle-1 in FIG. 3A, and the X-directional size=a1 and Y-directional size=b1 of the pattern. The tone data signify either data of the negative type or data of the positive type of a resist. ($\Delta$11, $\Delta$11') denote drawing process shifts, in other words, an X-directional dimension=$\Delta$11 and a Y-directional dimension=$\Delta$11' (in microns) which the pattern shifts during the drawing process of the used resist. Likewise, ($\Delta$12, $\Delta$12') and ($\Delta$13, $\Delta$13') denote developing process shifts and etching process shifts, respectively, in other words, X-directional dimensions=$\Delta$12 and $\Delta$13 and Y-directional dimensions=$\Delta$12' and $\Delta$13' which the pattern shifts during the developing process and etching process of the used resist.

The pattern information of the rectangle-2 is as indicated in FIG. 3A.

FIG. 3C indicates process shifts. The process shifts have a value which is obtained by adding up the drawing process shift, developing process shift and etching process shift explained with reference to FIG. 3B.

FIG. 3D shows an actual example. Here, the pattern shifts during the drawing process of the resist, as follows:

When the drawing process shifts ($\Delta$11, $\Delta$11') are (0.01 µm, 0.005 µm), respectively,
the X-directional dimension of the pattern becomes a1+$\Delta$11=a1+0.01 µm, and
the Y-directional dimension becomes b1+$\Delta$11'=b1+0.005 µm.

FIG. 3E indicates examples in the cases where the pattern thickens or becomes larger and fines or becomes smaller due to the process shifts.

The example in the case where the pattern thickens is a contact hole (positive type).

The example in the case where the pattern fines is a gate layer pattern (negative type).

In the above way, the pattern which is expected to be formed reflecting the design data, the tone data (negative or positive type), and the process shifts (drawing, developing and etching) of the used resist is obtained by the calculations, whereby the pattern can be displayed as shown in FIG. 2C or 2E already referred to.

Figure 4A:
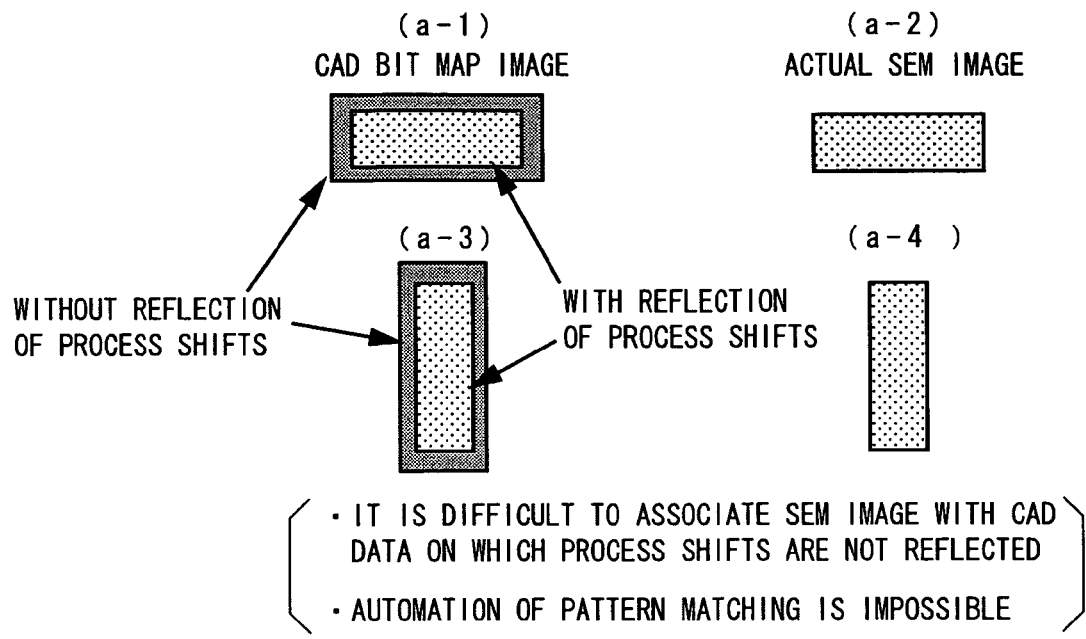
FIGS. 4A and 4B are diagrams for explaining actual examples in the invention.
Figure 4B:
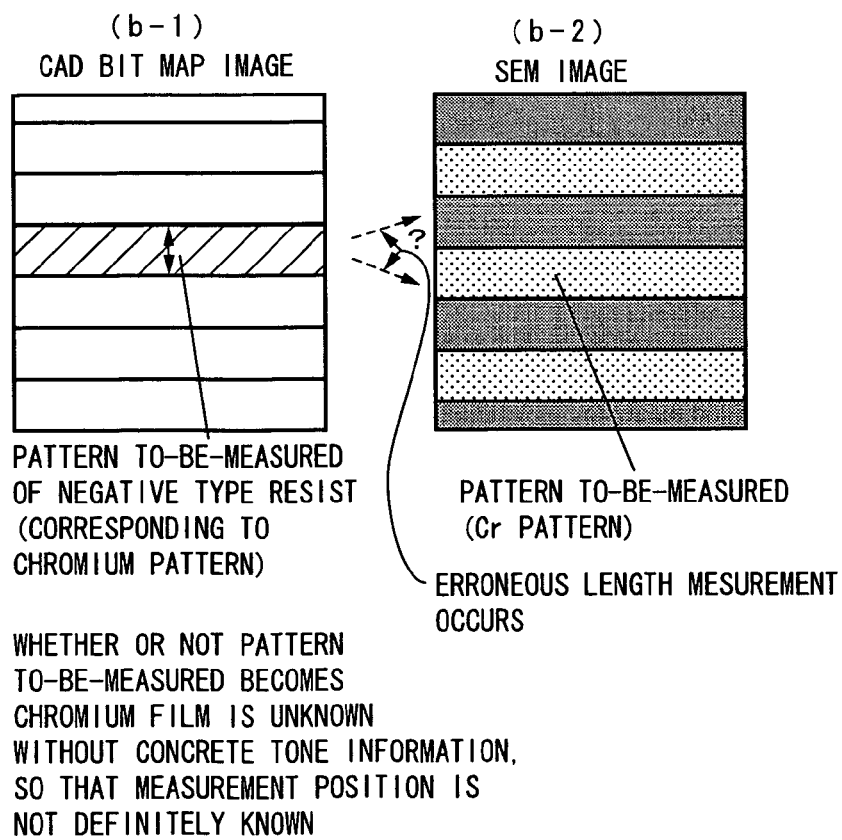

FIGS. 4A and 4B show diagrams for explaining the invention.

The actual example in FIG. 4A corresponds to a case where process shifts are missing.

(a-1) in FIG. 4A shows a CAD bit map image. This image is an image generated on the basis of CAD data.

(a-2) in FIG. 4A shows an example of an actual SEM image in the case where a pattern fabricated by exposing a resist to light, and developing and etching it on the basis of the image shown at (a-1) in FIG. 4A is observed with the SEM. In this case, no process shifts exist, so that the image conforming to the CAD data as they are (a pattern at (a-1) in FIG. 4A) and the pattern of the actual SEM image match, and the latter pattern can be easily specified and have its length measured.

On the other hand, (a-3) in FIG. 4A shows an example in which an outer pattern without the reflection of the process shifts and an inner pattern with the reflection of the process shifts are superposed and displayed.

(a-4) in FIG. 4A shows the pattern of an actual SEM image in the case where the process shifts are reflected. With the reflection of the process shifts, the pattern at (a-4) in FIG. 4A is obtained as the actual SEM image. If this pattern is compared (subjected to pattern matching) with the pattern without the reflection of the process shifts on the CAD data as shown at (a-3) in FIG. 4A, both the patterns do not match, and automatic pattern matching is impossible. In contrast, when the process shifts are reflected, the inner pattern at (a-3) in FIG. 4A is obtained, and this pattern matches with the pattern of the actual SEM image at (a-4) in FIG. 4A, and the latter pattern can be automatically specified and have its length measured.

As described above, the pattern of the actual SEM image is subjected to the pattern matching with the pattern in which the process shifts suited to the used resist have been reflected on the CAD data, whereby the designated pattern to-be-measured can be automatically found at a favorable precision so as to measure its length. Even if the pattern of the actual SEM image is subjected to the pattern matching with the pattern in which the process shifts are not reflected on the CAD data, it is very difficult to find the matching patterns, and the pattern to-be-measured cannot be automatically specified at the favorable precision so as to measure its length.

The actual example in FIG. 4B corresponds to a case where tone data are missing.

(b-1) in FIG. 4B shows an example of a CAD bit map image. This example is an example in which patterns are displayed on the basis of CAD data being design data. Here, when negative type or positive type information being the tone data is missing, a problem occurs in a case where the plurality of patterns having similar widths as shown at (b-1) in FIG. 4B (a hatched pattern is a subject for measurement). More specifically, in a case where the patterns of the CAD data as shown at (b-1) in FIG. 4B are drawn by a negative type resist (resist which is applied by coating onto a substrate formed with a Cr film) and where the resist is thereafter developed and etched, which parts of the patterns the Cr film remains on is unknown. (Incidentally, in the case of a negative type resist, the Cr film is formed, and in the case of a positive type resist, the Cr film is not formed, and the glass of the substrate is coated with the resist.) Accordingly, in a case where a SEM image as shown at (b-2) in FIG. 4B by way of example has been obtained, whether the pattern to-be-measured is a pattern having the Cr film or a pattern not having the Cr film is unknown, and the pattern to-be-measured is erroneously specified and has its length erroneously measured. In this regard, the erroneous measurement ascribable to the erroneous specification can be completely prevented by designating the tone data (negative or positive type) beforehand as in the invention.

Figure 5A:
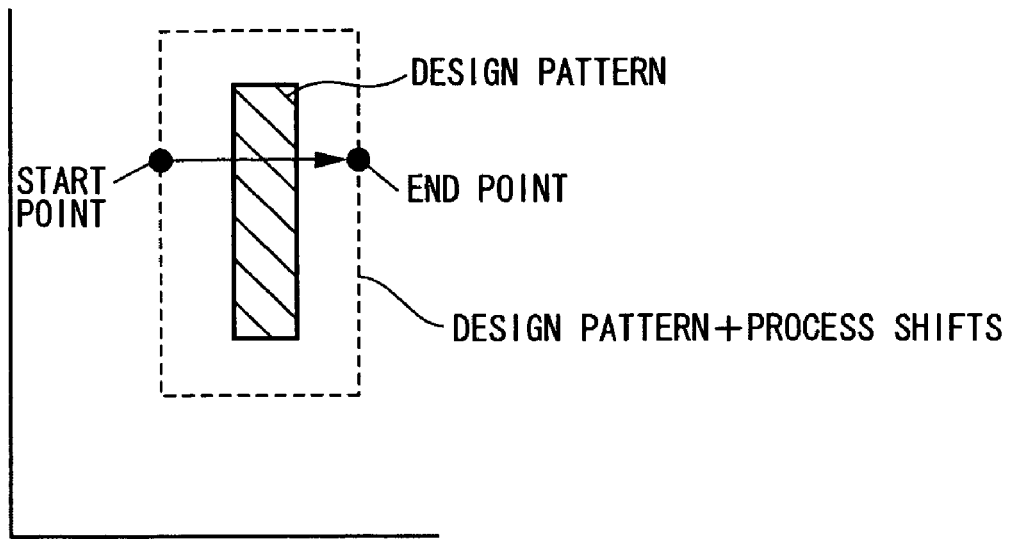
FIGS. 5A and 5B are diagrams for comparing position designation methods in the prior art and in the invention.
Figure 5B:
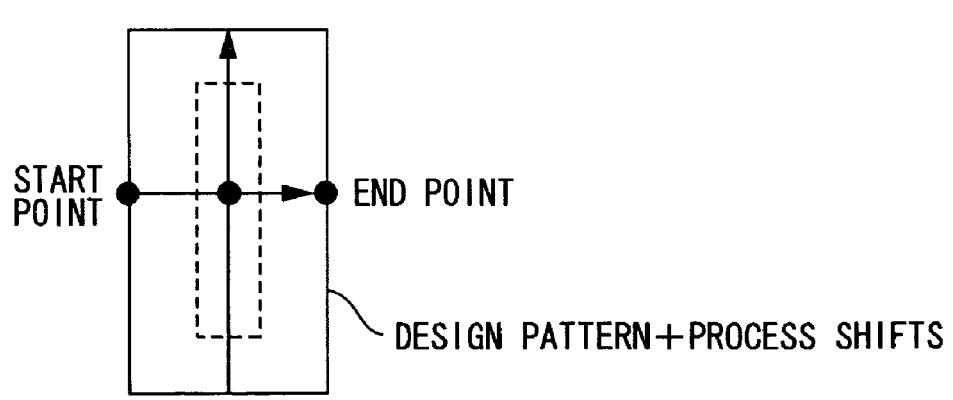

FIGS. 5A and 5B are diagrams explaining the invention.

FIG. 5A shows an example of the designation method in the related art. In the related art, the measurement position of a pattern on an actual SEM image is designated on a design pattern. Therefore, the measurement position can be designated on only the design pattern which is hatched in the figure, and a pattern of broken line as is the pattern on the actual SEM image cannot be coped with. Accordingly, the operator or person designates a start point and an end point indicated on the broken line of the pattern on the actual SEM image, one by one, whereupon he/she performs a length measurement.

FIG. 5B shows an example of the designation method in the invention. According to the invention, a pattern in which (design data+process shifts) have been computed is generated and displayed as indicated by a solid line in the figure. Therefore, a start point and an end point shown in the figure, after the reflection of the process shifts, can be automatically designated merely by designating a start point and an end point (or any desired points within the pattern) on the original design data. Besides, a distance from the start point to the end point automatically designated (or the width or length of the pattern including the designated points as measured in a left and right direction or in an up or down direction) can be automatically measured (the length or the like can be measured repeatedly a plurality of times, and data whose error falls within a predetermined range can be determined as length measurement data).

The invention can provide a pattern specification method and a pattern specification apparatus in which, even when patterns have microscopic dimensions and are in an enormous number, a pattern for a length measurement or the like can be specified among drawn patterns on the basis of design data, tone data and process shifts, reliably, precisely and fast without resorting to man power.

What is claimed is:

1. A pattern specification method for specifying a drawn microscopic pattern, comprising:
    creating a first pattern in which process shift information is reflected on a pattern expressed by design data;
    enlarging the drawn microscopic pattern to create a first enlarged pattern;
    performing pattern matching between a second pattern, which includes the first pattern and patterns surrounding the first pattern, and a second enlarged pattern, which includes the first enlarged pattern and enlarged patterns surrounding the first enlarged pattern;
    performing further pattern matching between the first pattern and the first enlarged pattern; and
    outputting an enlarged pattern that matches or having most matches based on the performing pattern matching and the performing the further pattern matching.

2. A pattern specification method as defined in claim 1, wherein the first pattern is created by reflecting tone data of a resist for drawing the pattern to-be-specified, in addition to the process shift information.

3. A pattern specification method as defined in claim 2, wherein the process shift information indicates at least one selected from the group consisting of a drawing process shift, a developing process shift and an etching process shift.

4. A pattern specification method as defined in claim 3, wherein a designated measurement position is displayed in an image of the specified pattern.

5. A pattern specification method as defined in claim 4, wherein the specified pattern is displayed by either of a mark or a specified color, so as to be distinguishable from the other patterns.

6. A pattern specification method as defined in claim 5, wherein a size of a place designated in the specified pattern is measured.

7. A pattern specification method as defined in claim 4, wherein a size of a place designated in the specified pattern is measured.

8. A pattern specification method as defined in claim 3, wherein the specified pattern is displayed by either of a mark or a specified color, so as to be distinguishable from the other patterns.

9. A pattern specification method as defined in claim 3, wherein a size of a place designated in the specified pattern is measured.

10. A pattern specification method as defined in claim 2, wherein a designated measurement position is displayed in an image of the specified pattern.

11. A pattern specification method as defined in claim 2, wherein the specified pattern is displayed by either of a mark or a specified color, so as to be distinguishable from the other patterns.

12. A pattern specification method as defined in claim 2, wherein a size of a place designated in the specified pattern is measured.

13. A pattern specification method as defined in claim 1, wherein the process shift information indicates at least one selected from the group consisting of a drawing process shift, a developing process shift and an etching process shift.

14. A pattern specification method as defined in claim 1, wherein a designated measurement position is displayed in an image of the specified pattern.

15. A pattern specification method as defined in claim 1, wherein the specified pattern is displayed by either of a mark or a specified color, so as to be distinguishable from the other patterns.

16. A pattern specification method as defined in claim 1, wherein a size of a place designated in the specified pattern is measured.

17. A pattern specification apparatus for specifying a drawn microscopic pattern, comprising:

means for creating a first pattern in which process shift information is reflected on a pattern expressed by design data;

means for enlarging the drawn microscopic pattern to create a first enlarged pattern;

means for performing pattern matching between a second pattern, which includes the first pattern and patterns surrounding the first pattern, and a second enlarged pattern, which includes the first enlarged pattern and enlarged patterns surrounding the first enlarged pattern;

means for performing further pattern matching between the first pattern and the first enlarged pattern; and means for outputting an enlarged pattern which matches or most matches based on the performing pattern matching and the performing further pattern matching.

18. A pattern specification method for specifying a drawn pattern, comprising:

enlarging a first pattern to create a first enlarged pattern;

performing pattern matching between a second pattern, which includes the first pattern and patterns surrounding the first pattern, and a second enlarged pattern, which includes the first enlarged pattern and enlarged patterns surrounding the first enlarged pattern;

performing further pattern matching between the first pattern and the first enlarged pattern; and outputting an enlarged pattern having most matches based on the performing pattern matching and the performing further pattern matching.

* * * * *